United States Patent [19]
Wilhelm

[11] Patent Number: 5,917,344
[45] Date of Patent: Jun. 29, 1999

[54] DRIVER CIRCUIT

[75] Inventor: Wilhelm Wilhelm, München, Germany

[73] Assignee: Siemens Aktiengesellschaft, Munich, Germany

[21] Appl. No.: 08/799,846

[22] Filed: Feb. 13, 1997

[30] Foreign Application Priority Data

Feb. 13, 1996 [DE] Germany ............................ 196 05 248

[51] Int. Cl.⁶ ................................................ H03K 19/086
[52] U.S. Cl. .............................. 326/126; 326/32; 326/33
[58] Field of Search .................................. 326/126–127, 326/31–33; 327/65

[56] References Cited

U.S. PATENT DOCUMENTS

| | | |
|---|---|---|
| 4,894,562 | 1/1990 | Cavaliere et al. . |
| 5,068,550 | 11/1991 | Barre ......................................... 326/18 |
| 5,381,057 | 1/1995 | Kuroda et al. . |
| 5,384,498 | 1/1995 | Wong ........................................ 326/31 |
| 5,473,272 | 12/1995 | Wilhelm et al. ........................ 326/126 |
| 5,539,350 | 7/1996 | Wilhelm .................................. 326/126 |

FOREIGN PATENT DOCUMENTS

| | | |
|---|---|---|
| 0 421 016 A1 | 4/1991 | European Pat. Off. . |
| 0 453 191 A2 | 10/1991 | European Pat. Off. . |
| 43 36 798 A1 | 6/1994 | Germany . |
| 3-283813 | 12/1991 | Japan ..................................... 326/126 |

OTHER PUBLICATIONS

An article by George R. Watson, entitled "Advances in Bipolar VLSI", in Proceedings of the IEEE, vol. 78, No. 11, Nov. 1990;.

Handbuch TTL–und CMOS Schaltkreise (Handbook TTL–and CMOS Switching Circuits) by Dr. Eberhad Kühn, Heidelberg, (1985) Page 90;.

*Primary Examiner*—Jon Santamauro
*Attorney, Agent, or Firm*—Herbert L. Lerner; Laurence A. Greenberg

[57] ABSTRACT

A driver circuit for driving a load connected between an output terminal and a reference potential, includes a first transistor having a collector connected to a first supply potential and an emitter connected to the output terminal. A second transistor has a collector connected to the output terminal and an emitter connected to the reference potential. An emitter-coupled transistor pair has bases to which a symmetrical control signal is applied, one collector which is coupled through a first resistor to the first supply potential and another collector which is coupled through a second resistor with the output terminal. A controllable current source supplies the transistor pair. A control device controls the current source in proportion to a supply voltage occurring between the first supply potential and the reference potential.

7 Claims, 1 Drawing Sheet

DRIVER CIRCUIT

BACKGROUND OF THE INVENTION

Field of the Invention

The invention relates to a driver circuit.

Emitter followers are used as a rule to drive lines or capacitive loads, particularly in bipolar logic circuits. The emitter follower is quite suitable for reversing the charge of the line or capacitive load at the switching edge at which the emitter follower transistor is made conducting. Conversely, at the edge at which the emitter follower transistor is blocked, it is fast enough only when the bias current of the emitter follower is selected to be high enough. However, that current is actually needed only during the discharging operation of the load capacitor or of the line impedance. During the remainder of the time, it could also be equal to zero without any disadvantage. That would produce considerable savings of supply capacity.

Essentially two possible devices that make use of that concept are known. An article by George R. Watson, entitled "Advances in Bipolar VLSI", in Proceedings of the IEEE, Vol. 78, No. 11, November 1990, proposes turning on the bias current of the emitter follower during the edge that blocks the emitter follower transistor, through the use of a differentiation circuit. The on-time should be proportional to the magnitude of the load. However, that necessitates an adaptation to the prevailing load. Accordingly, that type of circuit is not very suitable for cell structures in customer-specific integrated circuits. Moreover, differentiation requires a capacitor which can only be constructed in integrated circuitry by using a comparatively great amount of surface area.

Another possible device contemplates using two switches in a manner similar to CMOS technology. The problem then is that the cross current or the quadrature-axis component of the current in the state of repose must be kept at a low value, regardless of the temperature and supply voltage. A certain bias current is nevertheless necessary, because otherwise the switching time would be reduced considerably. According to U.S. Pat. No. 5,381,057, that problem is solved in such a way that the switch draws the current from the charge reservoir of a capacitor and adjusts the bias current accordingly. A disadvantage then is that the capacitance of the capacitor must be dimensioned to suit the frequency of the switching and the number of drivers, and as a rule a comparatively large capacitor is therefore necessary. However, a large capacitor can only be integrated with difficulty, if at all.

SUMMARY OF THE INVENTION

It is accordingly an object of the invention to provide an integratable driver circuit, which overcomes the hereinafore-mentioned disadvantages of the heretofore-known devices of this general type and which has a low bias current and high switching speed at both switching edges.

With the foregoing and other objects in view there is provided, in accordance with the invention, a driver circuit for driving a load connected between an output terminal and a reference potential, comprising a first transistor having a collector connected to a first supply potential and an emitter connected to an output terminal; a second transistor having a collector connected to the output terminal and an emitter connected to a reference potential; an emitter-coupled transistor pair having bases receiving a symmetrical control signal and having collectors; a first resistor coupling one of the collectors of the transistor pair to the first supply potential and a second resistor coupling the other of the collectors of the transistor pair with the output terminal; a controllable current source for supplying the transistor pair; and a control device for controlling the current source in proportion to a supply voltage occurring between the first supply potential and the reference potential.

In the driver circuit of the invention, the cross current is advantageously regulated in such a way that both temperature-dictated dictated fluctuations and changes in supply voltage are taken into account and compensated for.

In accordance with another feature of the invention, the controlled current source includes a third transistor having a collector which is connected to the coupled emitters of the transistor pair and an emitter which is coupled to a second supply potential through a third resistor. The control device has an amplifier with an input to which the supply voltage is applied, with the interposition of a damping element.

In accordance with a further feature of the invention, the first and second resistors each have the same resistance, which is twice that of the third resistor. The damping element is constructed in such a way that the supply voltage is divided in half.

In accordance with an added feature of the invention, the damping element includes a voltage divider that has two resistors of equal resistance.

In accordance with an additional feature of the invention, the amplifier circuit includes a fourth transistor having a base which is connected to the output of the damping element and a collector which is connected to the first supply potential, as well as a fifth transistor having a base which is connected to the reference potential, an emitter which is connected to a second supply potential with the interposition of a fourth resistor, and a collector which is connected both to the controllable current source and, with the interposition of a fifth resistor, to the emitter of the fourth transistor.

In accordance with yet another feature of the invention, the bases of the transistor pair are preceded by emitter followers, one of which is connected on the input side to the output of the damping element and the other of which is triggered with an asymmetrical input signal.

In accordance with yet a further feature of the invention, the other emitter follower has two transistors connected parallel with one another on the output side, one of the transistors is triggered with the one asymmetrical input signal, and the other is triggered with a further asymmetrical input signal. This accomplishes a logical linkage of the two asymmetrical input signals. The output signal is derived from the NOR linkage of the two asymmetrical input signals.

In accordance with an added feature of the invention, the first and second transistors are identical.

In accordance with a concomitant feature of the invention, the third transistor is identical to the first and/or second transistor.

Other features which are considered as characteristic for the invention are set forth in the appended claims.

Although the invention is illustrated and described herein as embodied in a driver circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE EMBODIMENTS

Figure 1:
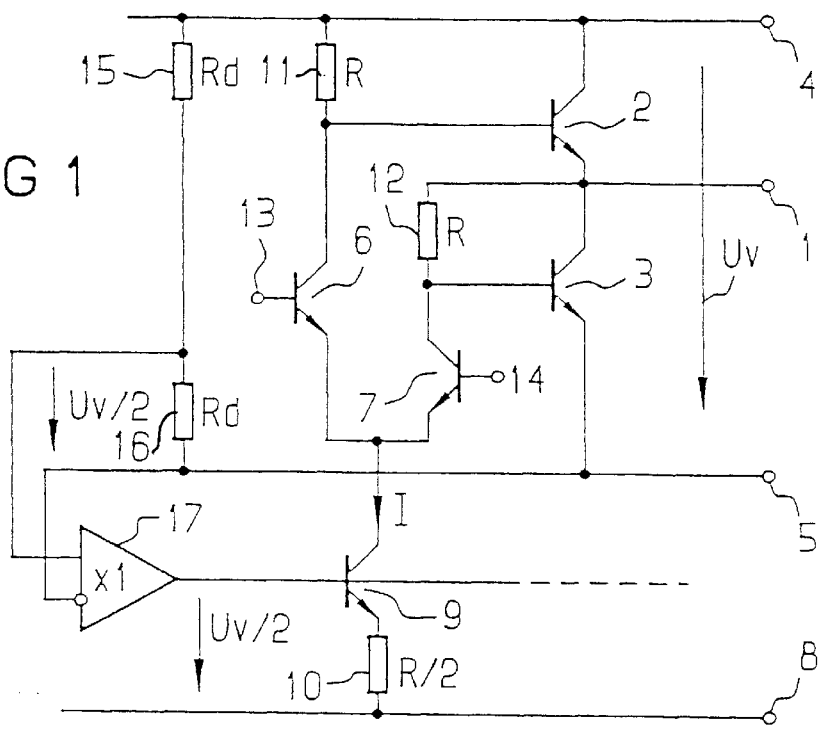
FIG. 1 is a schematic circuit diagram of a first general embodiment of a driver circuit according to the invention.

Referring now to the figures of the drawings in detail and first, particularly, to FIG. 1 thereof, there is seen an exemplary embodiment in which an output terminal 1, to which a non-illustrated load is to be connected, is connected to the emitter of an npn transistor 2 and to the collector of an npn transistor 3. The collector of the transistor 2 is connected to a positive or first supply potential 4, and the emitter of the transistor 3 is connected to a reference potential 5. A supply voltage Uv occurs between the supply potential 4 and the reference potential 5.

A pair of npn transistors 6 and 7 is also provided. The emitters of the two npn transistors 6 and 7 are coupled to one another and, with the interposition of a current source, to a negative or second supply potential 8. The controllable current source is formed by a third npn transistor 9 having a collector which is connected to the coupled emitters of the transistors 6 and 7 and an emitter which is connected through a third resistor 10 to the negative supply potential 8.

The collector of the transistor 6 is connected both to the base of the transistor 2 and through a first resistor 11 to the positive supply potential 4. The collector of the transistor 7 is connected to the base of the transistor 3, and a second resistor 12 is connected between the base and the collector of the transistor 3. The bases of the transistors 6 and 7 form respective inverting and noninverting inputs 13, 14 of a driver circuit.

A voltage divider which acts as a damping element and is connected between the positive supply potential 4 and the reference potential 5, includes two series-connected resistors 15 and 16, each having a resistance Rd. Through the use of the resistors 15 and 16 which have the same magnitude, the supply voltage Uv is divided in half, so that half the supply voltage Uv/2 is supplied to an amplifier 17 which has a gain of 1. The half supply voltage Uv/2 is tapped through the resistor 16. An output of the amplifier 17, to which the half supply voltage Uv/2 is also applied, controls the base of the transistor 9. The amplifier 17 can also control transistors of other non-illustrated current sources that belong to other likewise non-illustrated driver circuits.

Figure 2:
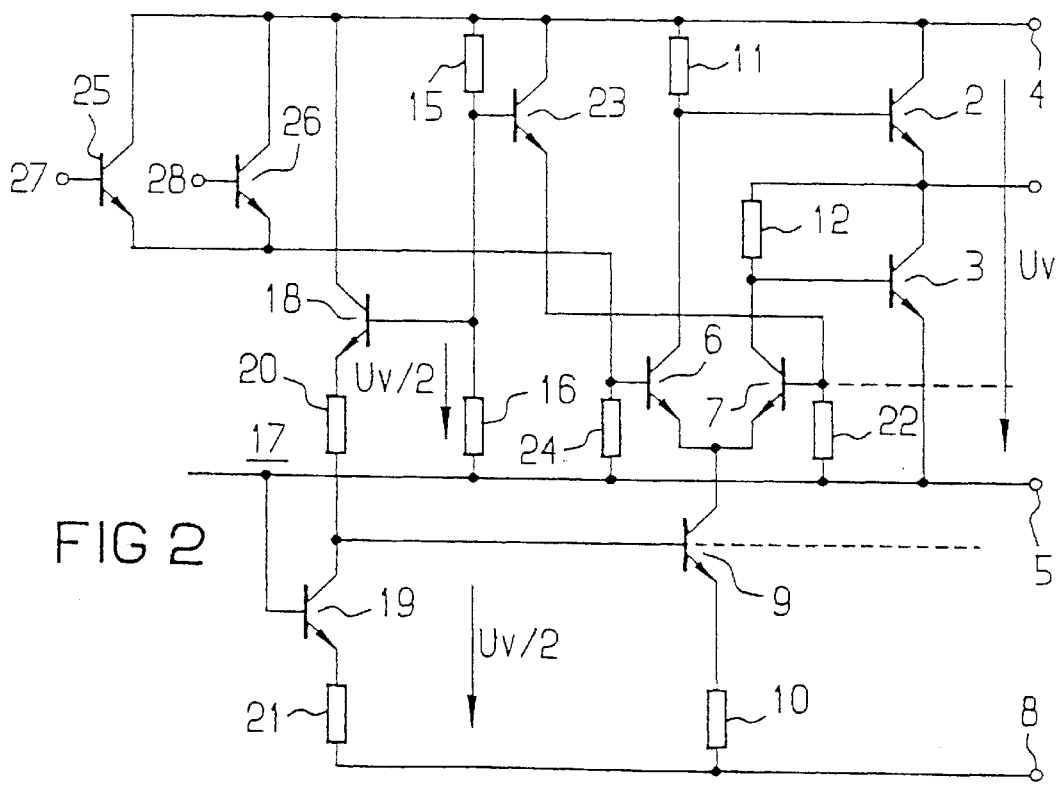
FIG. 2 is a schematic circuit diagram of an expansion of the driver circuit of FIG. 1.

The embodiment of FIG. 2 is expanded as compared with the embodiment of FIG. 1 and identical elements are provided with the same reference numerals. The amplifier 17 of FIG. 1 is formed in this case by two npn transistors 18 and 19 and fourth and fifth resistors 20 and 21. The transistor 18 is connected on its collector side to the positive supply potential 4 and on its base side to a tap of the voltage divider formed by the resistors 15 and 16. The emitter of the transistor 18 is coupled through the resistor 20 to the collector of the transistor 19. The transistor 19 has a base which is connected to the reference potential 5 and an emitter which is connected, with the interposition of the resistor 21, to the negative supply potential 8. The collector of the transistor 19 forms the output of the amplifier 17 and is therefore connected both to the base of the transistor 9 and optionally to the bases of other current source transistors.

The bases of the transistors 6 and 7 are also preceded by emitter followers. To that end, the base of the transistor 7 is coupled on one hand through a resistor 22 to the reference potential 5 and on the other hand to the emitter of a transistor 23. The transistor 23 has a collector which is connected to the positive supply potential 4 and a base which is connected to the base of the transistor 18. The base of the transistor 6 is connected on one hand through a resistor 24 to the reference potential 5 and on the other hand to the emitters of two npn transistors 25 and 26. The transistors 25 and 26 have collectors to which the positive supply potential 4 is applied. The bases of the transistors 25 and 26 are triggered by respective asymmetrical input signals 27 and 28. The signals 27 and 28 are OR-linked to one another, and this signal is inverted by the driver stage itself, so that a NOR linkage is accomplished with respect to the output terminal 1. The transistors 2, 3 and 9, as in the exemplary embodiment of FIG. 1, are preferably constructed identically.

The transistors 2 and 3 form two switches which are turned on and off in alternation depending on the position of the current switching stage formed by the transistors 6 and 7. A collector current I of the transistor 9 must be high enough to ensure that a cross current through the transistors 2 and 3 which is controlled through the temperature response and voltage response occurs. This is attained by using half the supply voltage Uv/2 to generate the current I. From this the following equation is obtained:

$$I=(Uv/2-U_{BES})/(R/2)=(Uv-2U_{BES})/R,$$

where $U_{BES}$ is the base-to-emitter saturation voltage of the transistors 9, 2 and 3, and R is the resistance of the resistors 11 and 12, i.e. twice the resistance of the resistor 10. From the above equation it follows that $$Uv=IR+2UBES.$$

Accordingly, the supply voltage above the driver stage, both in the H and the L state, is composed of two base-to-emitter voltages and one voltage that is equal to the product of the current I and the resistance R. However, the cross current flowing through the transistors 2 and 3 can never be higher than the current I.

The current I is determined by the resistance R and the supply voltage Uv and is accordingly easy to adjust. Controlling the cross current is also guaranteed under other supply voltages and temperatures. A further advantage is that a driver circuit according to the invention is functional even at low supply voltages.

I claim:

1. A driver circuit for driving a load connected between an output terminal and a reference potential, comprising:
   a first transistor having a collector connected to a first supply potential and an emitter connected to an output terminal;
   a second transistor having a collector connected to the output terminal and an emitter connected to a reference potential;
   an emitter-coupled transistor pair having bases receiving an input signal and having collectors;
   a first resistor coupling one of said collectors of said transistor pair to the first supply potential and a second resistor coupling the other of said collectors of said transistor pair with the output terminal;
   a controllable current source for supplying said transistor pair, said controllable current source having a third transistor with an emitter and with a collector connected to said coupled emitters of said transistor pair, and said controllable current source having a third resistor coupling said emitter of said third transistor to a second supply potential; and a control device for controlling said current source in proportion to a supply voltage occurring between the first supply potential and the reference potential, said control device having a differential amplifier with an input and a damping element through which the supply voltage is applied to said input of said differential amplifier.

2. The driver circuit according to claim 1, wherein:

said first and second resistors have the same given resistance;

said third resistor has half the given resistance; and said damping element divides the supply voltage in half.

3. The driver circuit according to claim 2, wherein said damping element is a voltage divider having two resistors with equal resistance.

4. The driver circuit according to claim 1, wherein:

said damping element has an output; and including:

at least a first emitter follower transistor having an emitter connected to one of said bases of said transistor pair and a base connected to said output of said damping element; and at least a second emitter follower transistor having an emitter connected to another one of said bases of said transistor pair and a base triggered by an asymmetrical input signal.

5. The driver circuit according to claim 4, including at least a third emitter follower transistor having an emitter connected to said other one of said bases of said transistor pair and a base triggered by another asymmetrical input signal.

6. The driver circuit according to claim 1, wherein said first and second transistors are identical to one another.

7. The driver circuit according to claim 1, wherein said third transistor is identical to at least one of said first and second transistors.

* * * * *